United States Patent [19]

Cuevas

[11] Patent Number: 5,047,816
[45] Date of Patent: Sep. 10, 1991

[54] SELF-ALIGNED DUAL-GATE TRANSISTOR
[75] Inventor: Yongbum P. Cuevas, San Jose, Calif.
[73] Assignee: VLSI Technology, Inc., San Jose, Calif.
[21] Appl. No.: 570,942
[22] Filed: Aug. 21, 1990
[51] Int. Cl.$^5$ .................. H01L 29/78; H01L 29/68; H01L 29/92
[52] U.S. Cl. .................. 357/23.14; 357/23.5; 357/23.6
[58] Field of Search .................. 357/23.14, 23.5, 23.6

[56] References Cited
U.S. PATENT DOCUMENTS
4,907,197 3/1990 Uchida .................. 357/23.5

Primary Examiner—Rolf Hille
Assistant Examiner—Wael Fahmy
Attorney, Agent, or Firm—Flehr, Hohbach, Test, Albritton & Herbert

[57] ABSTRACT

An MOS transistor device is formed in a semiconductor substrate of one type and has a source and drain of the opposite type. The transistor channel area between the source and drain is divided into three areas: a portion which abuts the source, a portion which abuts the drain and a portion which is between the other two channel portions. The transistor has three gates, including two gates and which are formed in a first layer of polysilicon and a third gate which is formed in a second layer of polysilicon. The first gate is positioned over the first portion of the transistor channel area abutting the source. The second gate overlies the second portion of the transistor channel area abutting the drain. The third gate 126 is positioned between the other two gates, overlies the third portion of the transistor channel area, and partially overlaps the first and second gates. The third gate is connected to the first so that the first and third gates together form a single gate of an MOS transistor device. The effective channel length of this combined gate is unaffected by variations in the masking and etching processes used to form the gates, which makes it particularly useful in analog circuits such as amplifier circuits. The MOS transistor of the present invention is also useful in high voltage applications, such as EEPROM memory decoder circuits, because this transistor does not suffer from gated diode breakdown.

2 Claims, 2 Drawing Sheets

SELF-ALIGNED DUAL-GATE TRANSISTOR

The present invention relates generally to MOS transistor devices and particularly to dual-gate MOS transistors suitable for use in analog circuits and in high voltage circuits such as EEPROM memory devices.

BACKGROUND OF THE INVENTION

The present invention is a dual-gate MOS device which is well suited for use in high voltage (i.e., around 15 volts) circuits, such as the high voltage circuitry used in EEPROM (electrically erasable and programmable read only memory) devices. The use of high voltages in EEPROM devices, primarily during programming of the memory's cells, can cause a problem known as gated diode breakdown. Gated diode breakdown occurs when a transistor is off and a high voltage is applied to its source or drain, which causes the PN junction to be strongly reverse biased The voltage on the gate of the transistor which causes the transistor's channel to be closed also generates an electrical field that decreases the breakdown voltage of the diodes associated with the drain and source regions.

The present invention overcomes this problem by separating the gate which turns off the transistor from the drain diffusion on which the high voltage is applied. As a result, the breakdown voltage of the diode formed by the drain and transistor channel is the normal breakdown voltage for such junctions.

The present invention is also suitable for use in amplifier circuits, such as cascode circuits, in which it is extremely important for the channel length of the transistor to be well controlled and consistent from device to device.

SUMMARY OF THE INVENTION

In summary, the present invention is an MOS transistor device formed in a semiconductor substrate of one type and having a source and drain of the opposite type. The transistor channel area between the source and drain is divided into three areas: a portion which abuts the source, a portion which abuts the drain and a portion which is between the other two channel portions. The transistor has three gates, including first and second gates formed in a first layer of polysilicon and a third gate that is formed in a second layer of polysilicon. The first gate is positioned over the portion of the transistor channel area abutting the source. The second gate overlies the portion of the transistor channel area abutting the drain. The third gate 126 is positioned between the other two gates, overlying the central portion of the transistor channel area, and partially overlaps the first and second gates. The third gate is also connected to the first gate so that the first and third gates together form a single gate of an MOS transistor device.

The effective channel length of this combined gate is affected neither by variations in the masking and etching processes used to form the gates, nor by alignment variations in the masks for the various layers of the device. The invariant nature of this transistor channel makes the MOS transistor of the present invention particularly useful in analog circuits such as amplifier circuits.

The MOS transistor of the present invention is also useful in high voltage applications, such as EEPROM memory decoder circuits, because this transistor does not suffer from gated diode breakdown.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
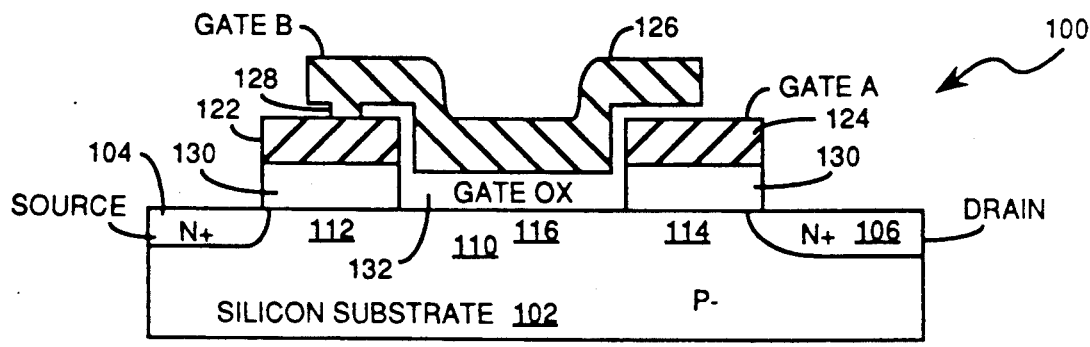
FIG. 1 is a cross sectional view of a first preferred embodiment of a dual gated transistor in accordance with the present invention.

Referring to FIG. 1, there is shown an MOS transistor device 100 formed in a semiconductor substrate 102 of one type and having a source 104 and drain 106 of the opposite type. The transistor channel area 110 between the source and drain is divided into three areas: a portion 112 which abuts the source, a portion 114 which abuts the drain and a portion 116 which is between the other two channel portions.

As shown, there are three gates, including two gates 122 and 124 which are formed in a first layer of polysilicon and a third gate 126 which is formed in a second layer of polysilicon. The first gate 122 is positioned over the first portion of the transistor channel 112 area abutting the source 104. The second gate 124 overlies the second portion of the transistor channel 114 area abutting the drain 106. The third gate 126 overlies the third portion of the transistor channel area 116 and partially overlaps the first and second gates. In this embodiment, the third gate 126 is directly connected to the first 122 gate by means of a buried contact 128, so that the first and third gates together form a single gate of an MOS transistor device. The second gate 124 is sometimes herein called Gate A, while the combined first and third gates is called Gate B. Typically, Gate A will be held at a constant voltage (e.g., 5 or 12 volts for the N-channel transistor shown in FIG. 1, or 0 volts for a comparable P-channel transistor) to ensure that the portion of the transistor channel 114 below it is turned on.

The MOS transistor 100 shown in FIG. 1 can be formed using conventional MOS device fabrication techniques such as those used for memory products which use two layers of polycrystalline silicon In accordance with the standard terminology used in the semiconductor industry, polycrystalline silicon is herein called "polysilicon". The first layer of polysilicon which is deposited and patterned on the device is called "the first polysilicon layer" or "Poly 1" and the second polysilicon layer to be deposited and patterned is called "the second layer of polysilicon" or "Poly 2". Furthermore, it should be understood that the two layers of polysilicon in all of these devices are separated from each other by an insulating layer, which is usually silicon oxide, but may be silicon nitride or may contain layers of silicon oxide and silicon nitride.

Before each layer of polysilicon is deposited and patterned, a distinct gate oxide layer is grown for the formation of MOS transistor gates. Thus the gate oxide 130 under the first and second gates 122 and 124 may have a somewhat different thickness than the gate oxide 132 under the third gate 126. For example, if the MOS transistor 100 is being used in an EPROM or EEPROM memory device, which employ floating gates in their memory cells, one of the two gate oxides 130 or 132 may be a very thin gate oxide (e.g., having a thickness of less than 100 Angstroms) while the other gate oxide is likely to be a regular gate oxide of perhaps 250 to 400 Angstroms. However, as will be understood by those skilled in the art of semiconductor processing, the use of a thin gate oxide can be limited to the floating gate transistors in the memory array by using an extra processing step to grow thicker gate oxides under the Poly 1 (or Poly 2) transistors outside the memory array than those transistors inside the memory array. Furthermore, it is possible to use the same gate oxide for both gates 122-124 and gate 126 because the Poly 2 gate can be formed and patterned with minimal impact on gate oxide. This is because polysilicon can be selectively etched without significantly etching silicon oxide. In any case, this variation in the thickness of gate oxides is not believed to be particularly important to the present invention, so long as the circuit designer takes it into account when estimating the gain that is to be associated with the transistor 100.

Figure 2:
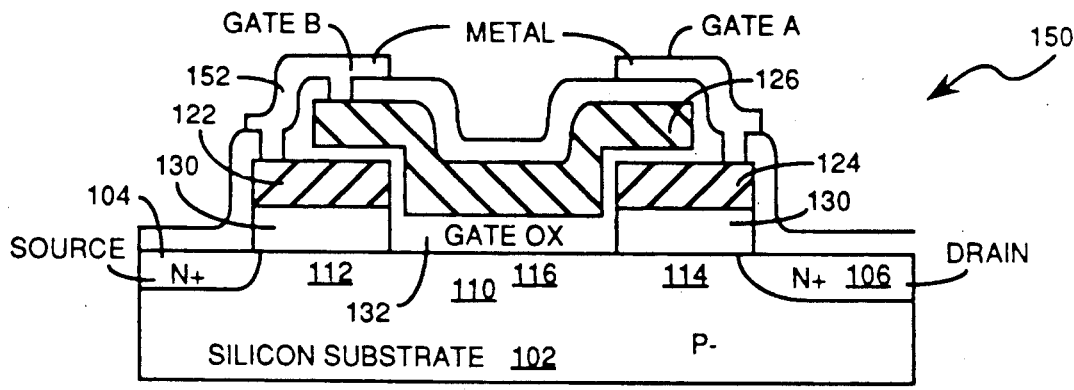
FIG. 2 is a cross sectional view of a second preferred embodiment of a dual gated transistor in accordance with the present invention.

The transistor 150 shown in FIG. 2 is the same as the transistor 100 of FIG. 1, except that the first and third gates are coupled by a metal interconnect 152 instead of a buried contact. The method of interconnected the first and third gates so as to form a single functional gate will depend on the manufacturing process used. FIGS. 1 and 2 show that there are at least two methods of forming the required connection.

Figure 3:
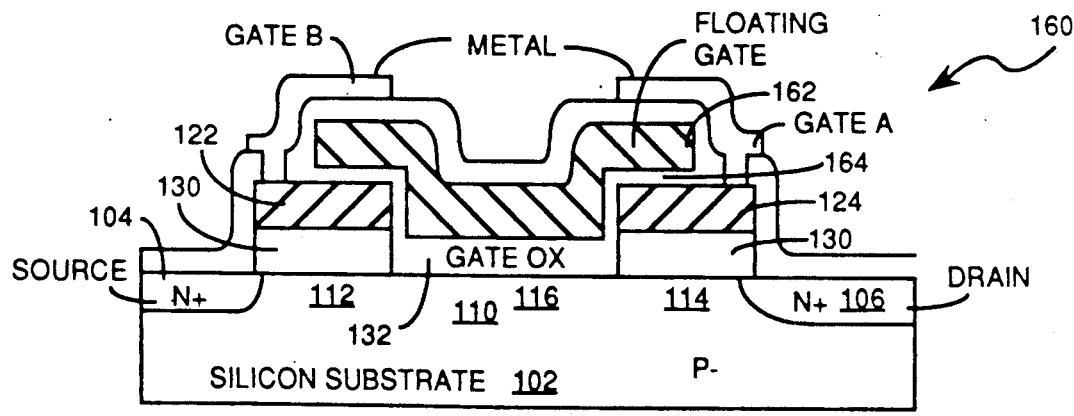
FIG. 3 is a cross sectional view of a third preferred embodiment of a dual gated transistor in accordance with the present invention.

The transistor 160 shown in FIG. 3 is different from those shown in FIGS. 1 and 2 in that the third gate 162 is a floating gate which is not directly coupled to anything else in the device. If the interpoly oxide 164 which separates the first and second polysilicon layers is not strong enough to withstand the voltages that are expected to be applied to the transistors 100 and 150 described above (e.g., a differential of 15 volts would not be unusual), the transistor 160 can be used in their place. The floating gate 162 can be coupled up to practically any voltage between the voltages of the first and second gates 122 and 124, depending on the amount that the Poly 2 third gate 162 overlaps the Poly 1 gates 122 and 124. In the specific case where the capacitance between the first and third gates is equal to the capacitance between the second and third gates, the floating gate's voltage will be about the average of the voltages of the first and second gates 122 and 124. Hence, in the worst case, the voltage drops across the interpoly oxide 164 will only be about half the voltage difference between the first two gates 122 and 124.

CONSTANT CHANNEL LENGTH

Figure 4:
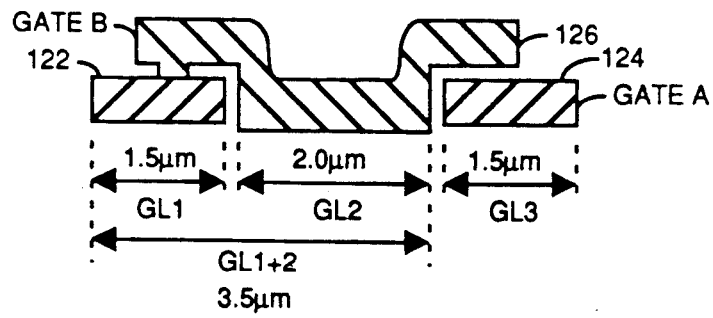
FIG. 4 is a partial cross sectional view of a preferred embodiment of a dual gated transistor in accordance with the present invention.

Referring to FIG. 4, the effective channel length of Gate B (the combined gate 122 plus gate 126) is unaffected by variations in the masking and etching processes used to form the gates, nor by alignment variations in the masks for the various layers of the device. For instance, assume that the nominal length of the channel under gate 122 is 1.5 microns and the nominal length of channel under gate 126 is 2.0 microns. The combined length of the channel under Gate B will be 3.5 microns. If the mask for forming gates 122 and 124 is underexposed or overexposed, identical malformations will generated in both gate 122 and gate 124. For example, if the mask is overexposed and gates 122 and 124 each have a channel length of 1.3 microns, the center gate 126 will have a channel 2.2 microns in length. Thus the channel under Gate B will continue to be 3.5 microns in length despite the overexposure of the Poly 1 gate mask. Similarly, under or over-etching of the first polysilicon layer will affect both gate 122 and 124 equally, and therefore the length of Gate B will be unaffected. Furthermore, any misalignment of the two polysilicon layers will not change the effective length of Gate B so long as the overlap of the gate 126 with gates 122 and 124 equals or exceeds the alignment tolerances of the manufacturing process.

The invariant nature of the effective channel length of Gate B makes the MOS transistor 100 of the present invention particularly useful in analog circuits such as amplifier circuits.

HIGH VOLTAGE APPLICATIONS

Figure 5:
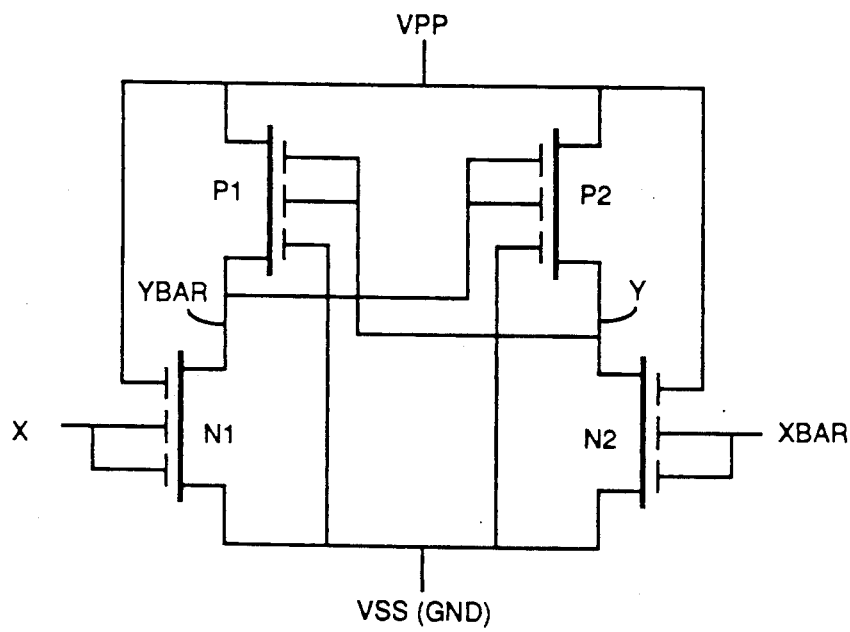
FIG. 5 is a block diagram of a high voltage switch using four dual gated transistors in accordance with the present invention.

The MOS transistor of the present invention is also useful in high voltage applications, such as EEPROM memory decoder circuits, because this transistor does not suffer from gated diode breakdown. Referring to FIG. 5, there is shown a simple high-voltage switch using four dual-gate transistors of the type shown in FIGS. 1-3. Transistors P1 and P2 are P-channel transistors and transistors N1 and N2 are N-channel transistors. Note that Gate A of each transistor is coupled to one of the two power supply nodes, guaranteeing that Gate A is always turned on. If the X node is at 5 volts, the XBAR node will be at 0 volts. Transistor N1 will be turned ON, pulling node YBAR down to ground, while transistor N2 will be turned OFF, cutting off node Y from ground. Since node YBAR is grounded, transistor P2 is turned ON, thereby charging node Y to VPP. Having node Y at VPP insures that P1 is OFF.

If VPP is equal to 10 or 12 volts, and four regular MOS transistors were used in this configuration, transistors P1 and N2 could go into gated diode breakdown because of the way that their drains and gates are biased. For instance, for transistor N2, its drain is at VPP and its gate is at ground, which is the standard configuration for gated diode breakdown.

Using the dual-gate MOS devices of the present invention, however, prevents gated diode breakdown. Gate A of transistor N2 is tied to VPP, and therefore most of the voltage drop across the transistor will occur between Gate B (which is at 0 volts) and its virtual drain (in the middle of the transistor channel). Since the field created by Gate B does not affect a drain/channel PN junction, there can be no gated diode breakdown.

Figure 6:
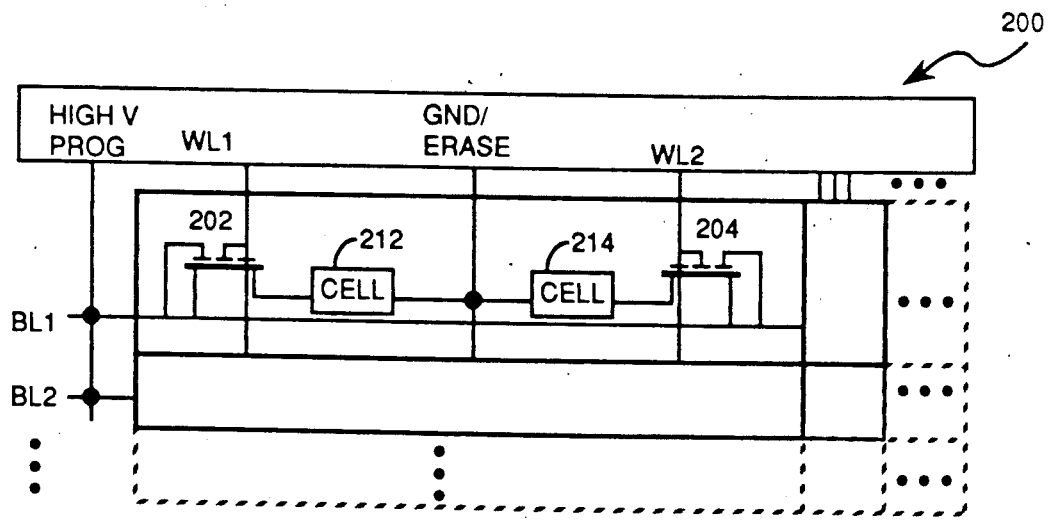
FIG. 6 is a block diagram of an EEPROM memory using an dual gated access control transistor.

Referring to FIG. 6, another possible application of the MOS transistor of the present invention is as the word line access select transistor in an EEPROM cell array 200. The dual-gate MOS transistors 202 and 204 have a high breakdown voltage and low leakage current when the corresponding cell 212 or 214 is not selected. The low leakage current is attributable to the lack of a leaky PN junction between the transistor's virtual drain and the substrate.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A semiconductor transistor comprising:

an MOS transistor device formed in a semiconductor substrate of one type and having a source and drain of the opposite type, a channel area between said source and drain, a first gate overlying a first portion of said channel area abutting said source, a second gate overlying a second portion of said channel area abutting said drain, and a third gate overlying a third portion of said channel area which is between said first and second portions of said channel area, said third gate partially overlying said first and second gates; said third gate connected to said first gate so that said first and third gates together form a single gate of said MOS transistor device.

2. A semiconductor transistor as set forth in claim 1, wherein said first and second gates are formed in a first layer of polycrystalline silicon on said semiconductor substrate and said third gate is formed in a second layer of polycrystalline silicon on said semiconductor substrate.

* * * * *